United States Patent [19]

Rodgers, III

[11] 4,292,605
[45] Sep. 29, 1981

[54] RELAXATION OSCILLATORS WITH ELECTRICAL CONTROL OF PERIODICITIES OF OSCILLATION

[75] Inventor: Robert L. Rodgers, III, Lancaster, Pa.

[73] Assignee: RCA Corporation, New York, N.Y.

[21] Appl. No.: 94,752

[22] Filed: Nov. 15, 1979

[51] Int. Cl.³ .............................................. H03K 3/28
[52] U.S. Cl. .................................. 331/111; 331/113 R
[58] Field of Search ............... 331/108 C, 108 D, 111, 331/113 R, 143, 144, 145

[56] References Cited

U.S. PATENT DOCUMENTS

| | | | |
|---|---|---|---|
| 3,037,172 | 5/1962 | Biard . | |
| 3,582,809 | 6/1971 | Rigby | 331/113 R |
| 3,688,213 | 8/1972 | Calaway | 331/113 R |
| 3,702,446 | 11/1972 | Steudel | 331/111 |
| 3,904,989 | 9/1975 | Cordell | 331/113 R |
| 4,083,019 | 4/1978 | Hamada et al. | 331/113 R |
| 4,083,020 | 4/1978 | Goldberg | 331/113 R |
| 4,233,575 | 11/1980 | Chapman et al. | 331/111 |

*Primary Examiner*—Siegfried H. Grimm
*Assistant Examiner*—Edward P. Westin
*Attorney, Agent, or Firm*—Eugene M. Whitacre; Paul J. Rasmussen; Allen L. Limberg

[57] ABSTRACT

In this relaxation oscillator first and second electrically controlled constant current generators are used to provide proportionately related first and second currents to first and second terminals, respectively, between which the timing capacitor is connected. Set-reset, or R-S, flip-flop means is set and reset by the voltage at the first and second terminals, respectively, departing in a first sense from the voltage at a reference voltage bus by a predetermined amount. First switching means responds to the R-S flip-flop reset condition to complete a connection of the first terminal to the reference voltage bus and responds to the R-S flip-flop set condition to interrupt that connection. Second switching means responds to the R-S flip-flop set condition to complete a connection of the second terminal to the reference voltage bus and responds to the R-S flip-flop reset condition to interrupt that connection. The rate at which oscillations proceed is linearly related to the amplitudes of the proportionately related currents supplied by the first and second constant current generators.

4 Claims, 2 Drawing Figures

RELAXATION OSCILLATORS WITH ELECTRICAL CONTROL OF PERIODICITIES OF OSCILLATION

The present application relates to relaxation oscillators with electrical control of the periodicity of oscillations.

G. W. Steudel in U.S. Pat. No. 3,702,466 entitled "VOLTAGE-CONTROLLED OSCILLATOR USING COMPLEMENTARY SYMMETRY MOSFET DEVICES" describes relaxation oscillators of a type in which a timing capacitor is connected in bridge between the drain-to-drain connections of first and second complementary metal-oxide-semiconductor (CMOS) field effect transistor (FET) pairs, each pair connected as an inverter amplifier with input at their interconnected gate electrodes and with output at their interconnected drain electrodes. A constant current generator is connected between the interconnection of the source electrodes of the p-channel FET's and the interconnection of the source electrodes of the n-channel FET's. The interconnected gate electrodes of the first pair and the interconnected gate electrodes of the second pair are connected to receive anti-phase switching signals from an R-S flip-flop. This provides a switched current bridge to alternately charge and discharge the timing capacitor, connected in the bridging position, from the same constant current generator. The flip-flop receives SET and RESET signals from opposite plates of the timing capacitor to complete the regenerative loop for generating the oscillations that control the switching of the bridge. The periodicity of these oscillations is inversely proportional to the value of the current supplied by the constant current generator, which is shown as comprising a voltage-to-current converter followed in cascade connection by a current mirror amplifier. While well suited to CMOS technology, the Steudel oscillator presents a problem when one attempts to use it in other integrated circuit (ic) technologies, such as a linear bipolar transistor i-c technology or a combined linear bipolar transistor and current injection logic ($I^2L$) technology, in that no good equivalent, or homolog, for the COMS converter amplifier is available with bipolar transistors.

The present invention is embodied in a relaxation oscillator in which, as in the Steudel oscillator, electrical control of the periodicity of its oscillations is effected by controlling the charging and discharging of a timing capacitor connected in a switched current bridge. However first and second electrically controlled constant current generators are used to provide proportionately related first and second currents to first and second terminals, respectively, between which the timing capacitor is connected. Set-reset, or R-S, flip-flop means is set and reset by the voltage at the first and second terminals, respectively, departing in a first sense from the voltage at a reference voltage bus by a predetermined amount. First switching means responds to the R-S flip-flop reset condition to complete a connection of the first terminal to the reference voltage bus and responds to the R-S flip flop set condition to interrupt that connection. Second switching means responds to the R-S flip-flop set condition to complete a connection of the second terminal to the reference voltage bus and responds to the R-S flip-flop reset condition to interrupt that connection. In contrast to the Steudel oscillator, the first switching means when conductive conducts not only the current flowing to alter charge on the timing capacitor—i.e. the second current—but also the first current; and the second switching means when conductive conducts not only the current flowing to alter charge on the timing capacitor—i.e. the first current—but also the second current. This eliminates the need for third and fourth switching means, as required in the Steudel oscillator and thus avoids the need for an equivalent, or homolog, of the CMOS inverter amplifier.

Figure 1:
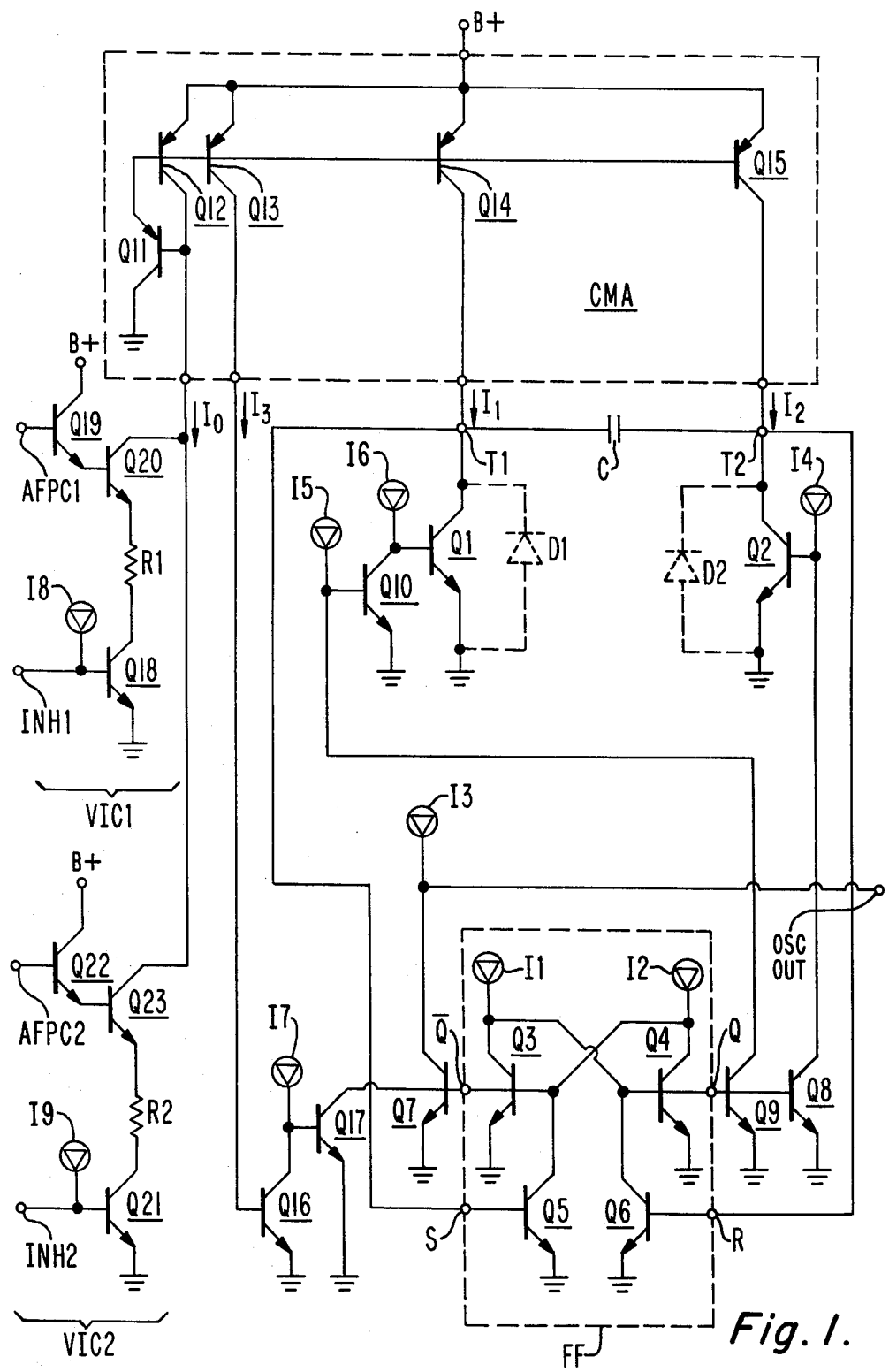
FIG. 1 is a schematic diagram of a voltage-controlled relaxation oscillator embodying the present invention. Encircled triangles symbolize constant current generators as provided by current injectors (hereafter simply "injectors") for $I^2L$ circuitry.

The voltage-controlled relaxation oscillator of FIG. 1 is shown as comprising two voltage-to-current converters VIC 1 and VIC 2, alternatively employed to provide a control current $I_O$, and a current controlled relaxation oscillator responsive to $I_O$ to provide a terminal OUT rectangular wave current pulses of periodicity inversely proportional to $I_O$. This current-controlled relaxation oscillator includes a current mirror amplifier CMA for responding to $I_O$ as input current to provide first and second output currents $I_1$ and $I_2$ to a first terminal T1 and to a second terminal T2, respectively, between which a timing capacitor C is connected. NPN transistors Q1 and Q2 function as first and second switching means, respectively, to alternately short-circuit T1 and T2 to a reference voltage bus—i.e., ground. Q1 is switched into conduction responsive to the set condition of a set-reset, or R-S, type of flip-flop FF and out of conduction responsive to the reset condition of FF. Conversely, Q2 is switched into conduction responsive to the reset condition of FF and out of conduction responsive to its set condition.

Flip-flop FF can take a variety of forms, the one shown here being of a known form compatible for integrated construction by the same manufacturing steps used for making associated $I^2L$ circuitry. This form of flip-flop has reset connection R, set connection S, output connections Q and $\overline{Q}$, injectors I1 and I2 applying their respective currents respectively to Q and to $\overline{Q}$, and grounded-emitter NPN transistors Q3 with collector at Q and base at $\overline{Q}$, Q4 with collector at $\overline{Q}$ and base at Q, Q5 with collector at $\overline{Q}$ and base at S, and Q6 with collector at Q and base at R. The cross-coupling of Q3 and Q4 is regenerative, preventing their simultaneous conduction except during transition from the conduction of one to other, as forced by conduction of set transistor Q5 or by conduction of reset transistor Q6. FF is placed into its set condition by the voltage applied to its set connection S from terminal T1 departing from ground by a predetermined amount, here the emitter-to-base offset voltage (or $V_{BE}$) required to switch a grounded-emitter NPN transistor Q5 into substantially full conduction of current supplied $\overline{Q}$ from injector I2. FF is placed into its reset condition by the voltage applied to its reset connection R from terminal T2 departing from ground by a predetermined amount, here the $V_{BE}$ required to switch NPN transistor Q6 into substantially full conduction of current supplied Q from an injector I1. FF has output connections Q and $\overline{Q}$, Q going high during set condition of FF and low during reset condition of FF, and $\overline{Q}$ going high during reset condition of FF and low during set condition of FF. The departure from ground of voltage at the FF output connection $\overline{Q}$ when it goes high is limited, by the base-emitter junctions of Q3 and of grounded-emitter NPN transistor Q7 in parallel therewith, to a $V_{BE}$ offset. The departure from ground of the voltage at the FF output connection Q when it goes high is limited, by the conduction of the base-emitter junctions of Q4 and of grounded-emitter NPN transistors Q8 and Q9 in parallel therewith, to a $V_{BE}$ offset.

Q7 provided constant-current-generator collector load by injector I3 has its collector connected to an output terminal OSC OUT for the oscillator. Alternatively, base drive for Q7 might be derived from a variety of other points in the oscillator—e.g., output connection Q of flip-flop FF or at the base of grounded-emitter NPN transistors Q1, Q2, or Q10.

Q8 and its constant-current-generator collector load provided by injector I4 form a logic inverter for coupling output connection Q of flip flop FF to the base of Q2. So, Q2 is rendered conductive by the current from injector I4 flowing thereto as base current when Q8 is rendered non-conductive by Q being low during the reset condition of flip-flop FF. Q2 is rendered non-conductive when Q8 is conductive to divert the current supplied by injector I4 from the base of Q2, Q8 responding to Q being high during the set cndition of flip-flop FF.

Q9 and its constant-current-generator collector load provided by injector I5 form another logic inverter for inverting output signal from the output connection Q of flip-flop FF. This logic inverter is followed in cascade by still another logic inverter comprising Q10 with constant-current-generator collector load provided by injector I6. So, the output signal from connection Q is applied after double inversion to the base of Q1, to render Q1 conductive when Q is high during the set condition of flip-flop FF, and to render Q1 non-conductive when Q is low during the reset condition of FF. The delay introduced by the extra stage of inversion in the circuit as shown, as compared to driving the base of Q10 directly from output connection $\overline{Q}$ of flip-flop FF better assures that relaxation oscillations will start with Q1 conductive, after oscillations are halted by clamping connection $\overline{Q}$ to ground, and that stalling of the relaxation process will not occur.

Beginning with the condition where connection $\overline{Q}$ has been previously clamped to ground, Q1 is conductive, Q2 is non-conductive and timing capacitor C stores no charge, operation is as follows. Current $I_1$ flows through Q1 and does not affect the charge stored in C. Current $I_2$ flows to charge C, and the voltage at terminal T2 departs in positive polarity from ground in accordance with Coulomb's Law. Displacement current from capacitor C to terminal T1 flowing in response to $I_2$ charging C is conducted to ground by Q1. Charging continues until terminal T2 rises to the $V_{BE}$ voltage required to render reset transistor Q6 conductive. The total charge time will vary essentially in linear proportion to the charging current $I_2$, of course.

Conduction of Q6 diverts the current from injector $I_1$ from the bases of Q4, Q8, and Q9, causing their non-conduction. Non-conduction of Q4 permits the current from injector I2 to divide between and flow into the bases of Q3 and Q7. The resultant conduction of Q3 causes it to conduct all the current supplied by injector $I_1$ as collector current. This provides for the non-conduction of Q4, Q8, and Q9 and the conduction of Q3 and Q7 to continue even though conduction of Q6 is subsequently curtailed, as the non-conduction of Q8 causes current from injector I4 to flow as base current to Q2 to bias Q2 into conduction for clamping terminal T2 to ground and thus removing base drive to Q6. This places flip-flop FF stably into its reset condition. The resultant conduction of Q7 causes it to sink as collector current the current from injector I3, which pulls the voltage at terminal OSC OUT low—i.e., to ground.

Non-conduction of Q9 causes current from injector $I_5$ to flow as base current to Q10 to bias Q10 into conduction for clamping the base of Q1 to ground. Q1 is thus no longer biased for conduction; and, as mentioned above, Q2 has been biased into conduction for clamping terminal T2 to ground. Just prior to the switching of Q1 from conduction to non-conduction and of Q2 from non-conduction to conduction, terminals T1 and T2 were at ground and $+V_{BE}$ potentials, respectively. So, since the voltage across C cannot change abruptly, and since the voltage at terminal T2 after switching perforce is ground owing to conduction of Q2, the voltage at terminal T1 will be forced to $-1V_{BE}$. Note that this is insufficient forward biasing of the collector-base junction of Q1 or of the collector-to-substrate junction D1 that is associated with a monolithically integrated vertical structure NPN transistor Q1, to cause appreciable flow through these junctions of the displacement current flowing to terminal T2 owing to discharge of capacitor C. This avoids undesirably high flows of substrate current. Rather, output current $I_1$ from CMA controls the change in charge in capacitor C, ramping up the voltage at terminal T1 in accordance with Coulomb's law from $-V_{BE}$ to ground as C is discharged and then from ground to $+V_{BE}$ as C is charged in opposite polarity. The resulting displacement current equal to $I_1$, flowing from C to terminal T2, flows to ground through Q2; and so does $I_2$ which does not alter the charge condition of capacitor C.

When the voltage at terminal T1 reaches the $V_{BE}$ value which applied via set connection S of flip-flop FF will cause conduction of Q5, the current from injector I2 is diverted from flowing to bases of Q3 and Q7. Q7 comes out of conduction and injector I3 pulls the OSC OUT terminal high. Q3 becomes non-conductive, allowing the current from injector $I_1$ to be apportioned amongst the bases of Q4, Q8 and Q9, biasing them into conduction. Conduction of Q4 continues the diversion of the current supplied by injector I2 from the bases of Q3 and Q7 when conduction of set transistor Q5 is discontinued with the conduction of Q1 clamping terminal $T_1$ to ground, for placing flip-flop FF stably in its set condition. Conduction of Q8 diverts the current supplied by injector I4 to itself and away from the base of Q2, removing Q2 from conduction so it no longer clamps terminal T2 to ground. Conduction of Q9 diverts the current applied by injector I5 to itself and away from the base of Q10. The resultant non-conduction of Q10 permits the current supplied by injector I6 to flow as base current to Q1, causing Q1 to conduct so as to clamp terminal $T_1$ to ground. Q1, now conductive, again sinks $I_1$ as well as the displacement current flowing to terminal T1 from capacitor C, responsive to $I_2$ being applied to capacitor C charging current. At the time of switching from conduction of Q2 to conduction of Q1 the voltages at terminals T2 and T1 are ground and $+V_{BE}$, respectively. Since voltage across a capacitor cannot change instantaneously, owing to the time required to alter its charge—and since, after switching, terminal T1 is grounded by the clamping of conductive Q1—terminal T2 is forced to be at $-V_{BE}$ potential. The collector-base junction of Q2 is not sufficiently forward biased to conduct appreciably. Nor will a collector-to-substrate junction D2 associated with Q2 be forward biased sufficiently that undesirably high substrate current will flow. Discharging of capacitor C as terminal T2 is ramped up from $-V_{BE}$ to ground is controlled by current $I_2$. When terminal T2 reaches ground potential, the initial operating conditions again obtain and the cycle of oscillation can recur.

The current mirror amplifier CMA used to provide output currents $I_1$, $I_2$ and $I_3$ from respective output connections proportional to the input current $I_0$ applied to its input connection is conventional in its design. Its common connection is to a positive operating voltage B+. Direct-coupled collector-to-base feedback via PNP emitter-follower transistor Q11 adjusts the emitter-to-base voltage of PNP transistor Q12 to condition it to supply a collector current essentially equal to the current $I_0$ demanded from the input connection of CMA. The emitter-to-base voltages PNP transistors Q13, Q14, and Q15 are made equal to the emitter-to-base voltage of Q12 for conditioning them to supply collector currents $I_3$, $I_1$ and $I_2$ respectively. Q12, Q13, Q14 and Q15 may, of course, be replaced by a single, multiple-collector PNP transistor.

If transistors Q14 and Q15 have identical collector current versus emitter-to-base voltage characteristics, the ramping of charge in timing capacitor C responsive to $I_1$ and the ramping of charge in C responsive to $I_2$ will take place over similar-length time intervals; and the rectangular wave at terminal OSC OUT will be a square wave. Transistors Q14 and Q15 may, however, have proportional collector currents for given emitter-to-base voltage related in other than 1:1 ratio. In such case the rectangular wave at terminal OSC OUT will exhibit alternating high and low conditions for intervals in substantially the same ratio as $I_2$ to $I_1$.

The current $I_3$ from current mirror amplifier CMA is used to signal the oscillator when frequency and phase control current $I_0$ is available for the oscillator. When $I_0$ is no longer supplied, the resulting cessation of $I_3$ as base current to NPN transistor Q16 allows the otherwise conductive Q16 to become non-conductive, no longer to divert to itself as collector current the current supplied by injector I7. The current from injector I7 flows instead as base current to Q17, which responds to clamp output connection $\overline{Q}$ of flip-flop FF to ground, forcing set of flip-flop FF. In certain controlled relaxation oscillator applications, this feature is unnecessary and Q16, Q17, I7 can be dispersed with together with means for supply it current $I_3$.

This feature is useful, however, where one wishes to switch from one oscillator control signal to another. As shown in FIG. 1 such switching may be accomplished using two voltage-to-current converters VIC1 and VIC2 alternately keyed out of operation.

VIC1 is activated absent the application of an inhibit signal to its inhibit terminal INH1 to reverse-bias its base-emitter junction. Current then flows from injector I8 to the base of NPN transistor Q18 to clamp its collector, and the end of a resistor R1 connected thereto, to a voltage close to ground. A unidirectionally-varying, positive frequency-and-phase-control voltage applied to terminal AFPC1 of VIC1 is coupled by the emitter-follower actions of cascaded NPN transistors Q19 and Q20 to appear decremented by $2V_{BE}$ offset at the other end of R1, to control in accordance with Ohm's Law the current flow through R1. This current flowing as the emitter current of Q20 causes Q20 to demand a collector current α times as large, α being a factor very close to unity if Q20 is of reasonably good design.

At the same time voltage-to-current converter VIC2 is inactivated by the application of an inhibit signal to its inhibit terminal INH2 to reverse the base-emitter junction of NPN transistor Q21. This causes Q21 to be non-conductive. A unidirectionally-varying positive frequency-and-phase-control voltage applied to terminal AFPC2 of VIC2 is coupled by the emitter-follower actions of cascaded NPN transistors Q22 and Q23 to be applied, decremented by a $2V_{BE}$ offset at the end of a resistor R2 connected at its other end to the collector of Q21. The high resistance proffered by the collector of non-conductive Q21 prevents any appreciable current flow through R2 responsive to the voltage applied thereto from the collector of Q23. No appreciable emitter current flows from Q23, and consequently Q23 makes no appreciable demand for collector current from the input connection of current mirror amplifier CMA.

Subsequent application of inhibit signal to inhibit terminal INH1 of voltage-to-converter VIC1 and not to inhibit terminal INH2 of voltage-to-converter VIC2 will cause $I_0$ to respond to the phase-and-frequency-control voltage applied to terminal AFPC2 of VIC2, rather than to that applied to terminal AFPC1 of VIC1 as in the case described in the preceding two paragraphs.

Figure 2:
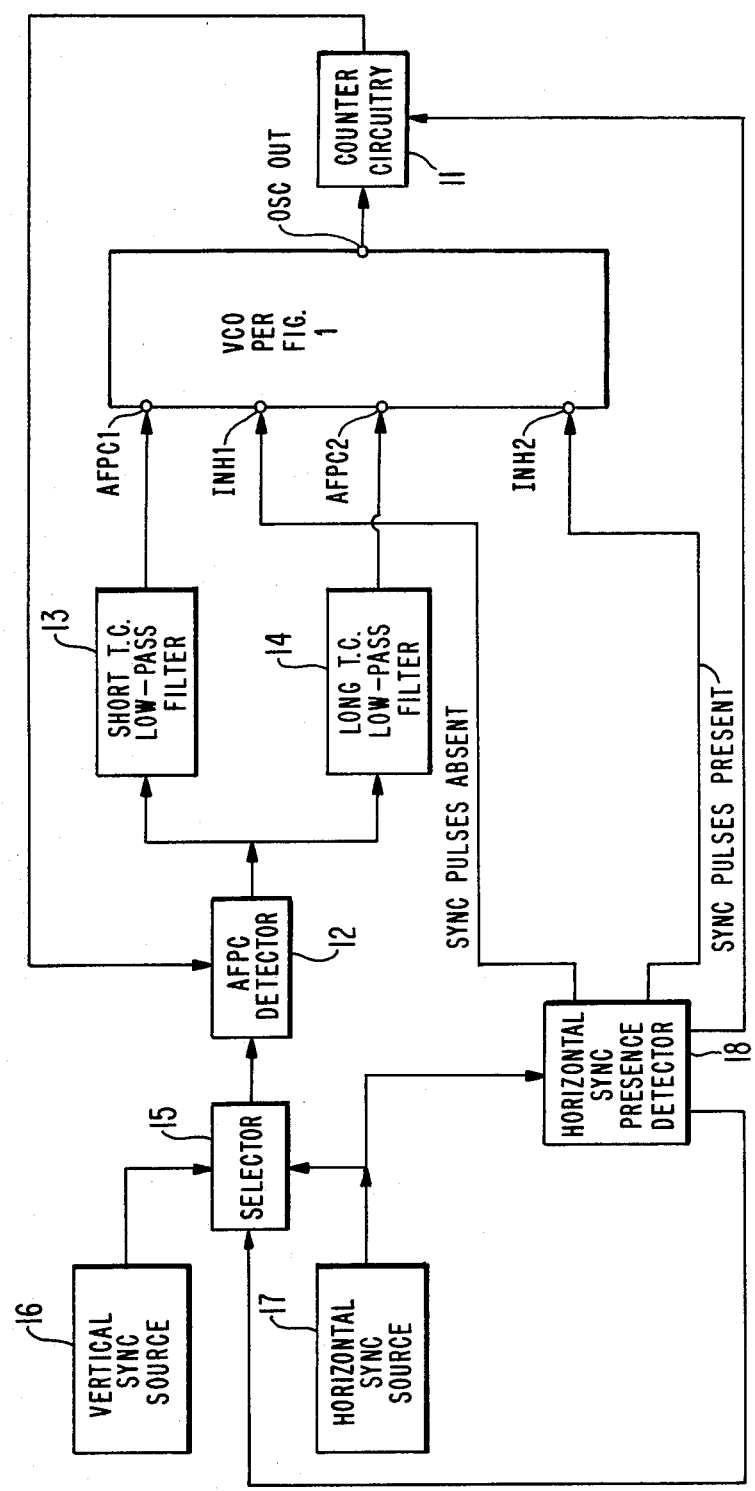
FIG. 2 is a block schematic diagram of a phase locked loop employing the controlled relaxation oscillator.

FIG. 2 shows how the VCO of FIG. 1 is used in a television camera system, wherein camera horizontal and vertical sync is developed from the VCO output signal in ensuing counter circuitry 11 driven from the OSC OUT terminal. Camera horizontal sync is applied from counter circuitry 11 to one of the inputs of a product detector 12 used to develop two AFPC signals, a first applied via relatively short-time-constant low-pass filter 13 to the AFPC1 terminal of the VCO, and a second applied via a relatively long-time-constant low-pass filter 14 to the AFPC2 terminal of the VCO. Selector means 15, which may per convention take the form of an electronic switching network, connects one of vertical sync source 16 and horizontal sync source 17 to another input of product detector 12 to be synchronously detected against the camera horizontal and vertical sync sources, respectively. A horizontal sync pulse presence detector 18 detects when the horizontal sync source 17 is connected for supplying, for applying inhibit signal to terminal INH2 so AFPC detector 12 is coupled via short-time-constant low-pass filter 13 to control the VCO, for actuating selector 15 to apply external horizontal sync from source 17 to AFPC detector 12, and for conditioning the counter circuitry 11 to apply camera horizontal sync to AFPC detector 12 for comparison with external horizontal sync from source 17. If there is no supply of horizontal sync pulses from source 17 or it is disconnected from circuit, horizontal sync presence detector 18 responds to the resultant lack of horizontal sync pulses for applying inhibit signal to terminal INH1 so AFPC detector 12 is coupled via long-time-constant low-pass filter 14 to control the VCO, for actuating selector 15 to apply external vertical sync from source 16 to AFPC detector 12, and for conditioning the counter circuitry 11 to apply camera vertical sync to AFPC detector 12 for comparison with external vertical sync from source 16.

One skilled in the art and armed with the foregoing disclosure will be enabled to design other relaxation oscillators with controlled periodicity of oscillations, which oscillators embody the present invention. For example, one may insert a first unilaterally conductive element between the collector of Q1 and terminal T1 poled for conduction of Q1 collector current, and insert a second unilaterally conductive element between the collector of Q2 and terminal T2 poled for conduction of Q2 collector current. These unilaterally conductive elements can prevent reverse-biasing of the collector junctions of Q1 and Q2, while permitting R-S flip-flops and switching logic switching between ground and voltages greater than emitter-to-base potential, $V_{BE}$.

What is claimed is:

1. A relaxation oscillator with electrical control of the periodicity of its oscillations comprising:

a reference voltage bus;

a timing capacitor;

first and second terminals between which said timing capacitor is connected;

first and second electrically controlled constant current generators respectively supplying a first current to said first terminal and a second current proportional to said first current to said second terminal;

R-S flip-flop means set by the voltage at said first terminal departing in a first sense from said reference voltage by a predetermined amount and reset by the voltage at said second terminal departing in said first sense from said reference voltage by a predetermined amount;

first switching means responding to the set condition of said R-S flip-flop for completing connection of said first terminal to said reference voltage bus and responding to the reset condition of said R-S flip flop for interrupting connection of said first terminal to said reference voltage bus; and second switching means responding to the reset condition of said R-S flip-flop for completing connection of said second terminal to said reference voltage bus and responding to the set condition of said R-S flip-flop for interrupting connection of said second terminal to said reference voltage bus.

2. A relaxation oscillator as set forth in claim 1 wherein said first switching means comprises a first transistor with an emitter-base junction, with a collector-base junction, with an emitter electrode connected to said reference voltage bus, with a collector electrode connected to said first terminal, and with a base electrode; wherein said second switching means comprises a second transistor with an emitter-base junction, with a collector-base junction, with an emitter electrode connected to said reference voltage bus, and with a base electrode; wherein said R-S flip-flop means includes means for setting said R-S flip-flop means responsive to the voltage at said first terminal departing in a first sense from said reference voltage by an amount no larger than the offset voltage across a forward-biased semiconductor junction; wherein said R-S flip-flop means includes means for resetting said R-S flip-flop means responsive to the voltage at said second terminal departing in a first sense from said reference voltage by an amount no larger than the offset voltage across a forward-biased semiconductor junction; wherein means are provided for applying output signal from said R-S flip-flop means to the base electrode of said first transistor for biasing its emitter-base junction into conduction during the set condition of said R-S flip-flop means and for clamping the voltage at the base electrode of said first transistor to said reference voltage bus during the reset condition of said R-S flip-flop means, and wherein means are provided for applying output signal from said R-S flip-flop means to the base electrode of said second transistor for biasing its emitter-base junction into conduction during the reset condition of said R-S flip-flop means and for clamping the voltage at the base electrode of said second transistor to said reference voltage bus during the set condition of said R-S flip-flop means.

3. A relaxation oscillator as set forth in claim 1 including means responsive to said first and second electrically controlled constant current generators for setting said R-S flip-flop means when said first and second electrically controlled constant current generators are not supplying said first and second currents.

4. A relaxation oscillator as set forth in claim 3 wherein said first and second electrically controlled constant current generators comprise:

a plural-output current amplifier having an input connection, having a first output connection to said first terminal for supplying said first current, and having a second output connection to said second terminal for supplying said second current;

a plurality of voltage-to-current converter means with respective input connections for receiving periodicity-control voltages and with respective output connections to the input connection of said plural-output current amplifier; and selective inhibit means for inhibiting the operation of at least all but a selected one of said voltage-to-converter means at any time.

* * * * *